US008652908B2

United States Patent
Kim et al.

(10) Patent No.: US 8,652,908 B2
(45) Date of Patent: Feb. 18, 2014

(54) SEMICONDUCTOR DEVICES EMPLOYING HIGH-K DIELECTRIC LAYERS AS A GATE INSULATING LAYER AND METHODS OF FABRICATING THE SAME

(75) Inventors: WeonHong Kim, Suwon-si (KR); Dae-Kwon Joo, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 26 days.

(21) Appl. No.: 13/240,327

(22) Filed: Sep. 22, 2011

(65) Prior Publication Data
US 2012/0129330 A1 May 24, 2012

(30) Foreign Application Priority Data
Nov. 22, 2010 (KR) .................. 10-2010-0116338

(51) Int. Cl.
*H01L 21/8238* (2006.01)
*H01L 21/4763* (2006.01)

(52) U.S. Cl.
USPC ...... 438/275; 438/216; 438/591; 257/E21.625

(58) Field of Classification Search
USPC ........... 438/199, 216, 275, 591; 257/E21.625
See application file for complete search history.

(56) References Cited

U.S. PATENT DOCUMENTS

| 6,642,131 B2 | 11/2003 | Harada |
| 7,564,108 B2 | 7/2009 | Wang et al. |
| 2010/0327373 A1* | 12/2010 | Carter et al. ................. 257/392 |

FOREIGN PATENT DOCUMENTS

| JP | 2004-342775 A | 12/2004 |
| KR | 10-2003-0024897 A | 3/2003 |
| KR | 10-2004-0037568 A | 5/2004 |

* cited by examiner

*Primary Examiner* — Thanhha Pham
(74) *Attorney, Agent, or Firm* — Lee & Morse, P.C.

(57) ABSTRACT

A method of fabricating a semiconductor device includes providing a semiconductor substrate having a first region and a second region, forming a nitrogen-containing lower gate insulating layer on the semiconductor substrate, forming an upper gate insulating layer on the nitrogen containing lower gate insulating layer, forming a lower metal layer on the upper gate insulating layer; and selectively removing the lower metal layer in the first region such that a lower metal layer pattern remains in the second region, wherein the upper gate insulating layer in the first region prevents the lower gate insulating layer in the first region from being etched during removing of the lower metal layer in the first region. A semiconductor device fabricated by the method is also provided.

11 Claims, 4 Drawing Sheets

SEMICONDUCTOR DEVICES EMPLOYING HIGH-K DIELECTRIC LAYERS AS A GATE INSULATING LAYER AND METHODS OF FABRICATING THE SAME

CROSS-REFERENCE TO RELATED APPLICATIONS

Korean Patent Application No. 10-2010-0116338, filed on Nov. 22, 2010, in the Korean Intellectual Property Office, and entitled: "Semiconductor Devices Employing High-K Dielectric Layers As a Gate Insulating Layer and Methods of Fabricating the Same," is incorporated by reference herein in its entirety.

BACKGROUND

1. Field

The present disclosure herein relates to semiconductor devices and methods of fabricating the same. More specifically, the present disclosure relates to semiconductor devices employing high-k dielectric layers as a gate insulating layer and methods of fabricating the same.

2. Description of Related Art

Semiconductor devices may include complementary metal-oxide-semiconductor (CMOS) integrated circuits composed of N-channel MOS transistors and P-channel MOS transistors for low power consumption. High-k dielectric layers and metal layers may be used as gate insulating layers and gate electrodes, respectively to improve the integration density and the performance of the semiconductor devices. Further, the metal gate electrodes of the N-channel MOS transistors may be formed of a different material from the metal gate electrodes of the P-channel MOS transistors to optimize threshold voltage characteristics of the N-channel MOS transistors and the P-channel MOS transistors. The metal gate electrodes of the N-channel MOS transistors may be formed of a material having different work function from the metal gate electrodes of the P-channel MOS transistors.

SUMMARY

According to an embodiment, there is provided a method of fabricating a semiconductor device, the method including providing a semiconductor substrate having a first region and a second region, forming a nitrogen-containing lower gate insulating layer on the semiconductor substrate, forming an upper gate insulating layer on the nitrogen-containing lower gate insulating layer, forming a lower metal layer on the upper gate insulating layer, and selectively removing the lower metal layer in the first region to form a lower metal layer pattern in the second region, wherein the upper gate insulating layer in the first region prevents the nitrogen-containing lower gate insulating layer in the first region from being etched during removing of the lower metal layer in the first region.

The first region and the second region may be an N-channel MOS transistor region and a P-channel MOS transistor region, respectively.

The forming of the nitrogen-containing lower gate insulating layer may include forming a lower high-k dielectric layer on the semiconductor substrate, and nitrifying the lower high-k dielectric layer.

The forming of the upper gate insulating layer may include forming an upper high-k dielectric layer on the lower gate insulating layer, the upper high-k dielectric layer being a metal oxide layer or a metal silicate layer, and applying at least one of a nitrification process and an annealing process to the upper high-k dielectric layer.

The nitrification process may be applied to the upper high-k dielectric layer to form the upper gate insulating layer, and after the nitrification process is applied, the upper gate insulating layer may have a nitrogen concentration that is lower than that of the nitrogen-containing lower gate insulating layer.

The lower metal layer may be formed by sequentially stacking a first titanium nitride layer, an aluminum layer and a second titanium nitride layer.

The method may further include forming an upper metal layer on the substrate after forming the lower metal layer pattern.

The method may further include forming a lanthanum-containing material layer on the substrate after forming the lower metal layer pattern, and forming an upper metal layer on the substrate after forming the lower metal layer pattern.

During the selectively removing of the lower metal layer in the first region, the upper gate insulating layer in the first region may be partially etched, such that at least a portion of the upper gate insulating layer remains on the nitrogen-containing lower gate insulating layer in the first region after the lower metal layer in the first region has been selectively removed.

According to an embodiment, there is provided a semiconductor device including a semiconductor substrate having a first region and a second region, a first gate pattern on one predetermined region of the semiconductor substrate in the first region; and a second gate pattern on another predetermined region of the semiconductor substrate in the second region. The first gate pattern may include a first nitrogen-containing lower gate insulating layer pattern and a first metal gate electrode which are sequentially stacked, and the second gate pattern may include a second nitrogen-containing lower gate insulating layer pattern, a second upper gate insulating layer pattern and a second metal gate electrode which are sequentially stacked.

Each of the first and second nitrogen-containing lower gate insulating layer patterns may include a nitrogen-containing high-k dielectric layer.

The nitrogen-containing high-k dielectric layer may include a nitrified metal oxide layer or a nitrified metal silicate layer.

The second upper gate insulating layer pattern may include a nitrogen-containing high-k dielectric layer or a nitrogen-free high-k dielectric layer.

The second upper gate insulating layer pattern may be a nitrogen-containing high-k dielectric layer, and a nitrogen concentration of the second upper gate insulating layer may be lower than that of the second nitrogen-containing lower gate insulating layer pattern.

The first metal gate electrode may be formed of a same metal layer as the second metal gate electrode.

The first gate pattern may further include a first upper gate insulating layer pattern between the first nitrogen-containing lower gate insulating layer pattern and the first metal gate electrode. The first upper gate insulating layer pattern may be formed of a same material layer as the second upper gate insulating layer pattern, and the first upper gate insulating layer pattern may be thinner than the second upper gate insulating layer pattern.

According to an embodiment, there is provided a method of fabricating a semiconductor device, the method including forming a nitrogen-containing lower gate insulating layer on a semiconductor substrate having a first region and a second region, forming an upper gate insulating layer on the nitrogen-containing lower gate insulating layer, forming a lower metal layer on the upper gate insulating layer, and selectively removing the lower metal layer in the first region to form a lower metal layer pattern in the second region and partially removing the upper gate insulating layer to form a residue layer in the first region and in upper gate insulating layer pattern in the second region.

The method may further include forming a lanthanum-containing material layer and an upper metal layer on the semiconductor substrate, forming a hard mask layer on the upper metal layer, and performing annealing such that lanthanum atoms in the lanthanum-containing material layer diffuse toward an interface between the semiconductor substrate and the nitrogen-containing lower gate insulating layer.

After the annealing, the method may further include removing the hard mask layer, the upper metal layer, the lower metal layer pattern and the lanthanum-containing material layer to expose the residue layer and the upper gate insulating layer pattern, and forming a gate metal layer on the residue layer and the upper gate insulating layer pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Figure 1:
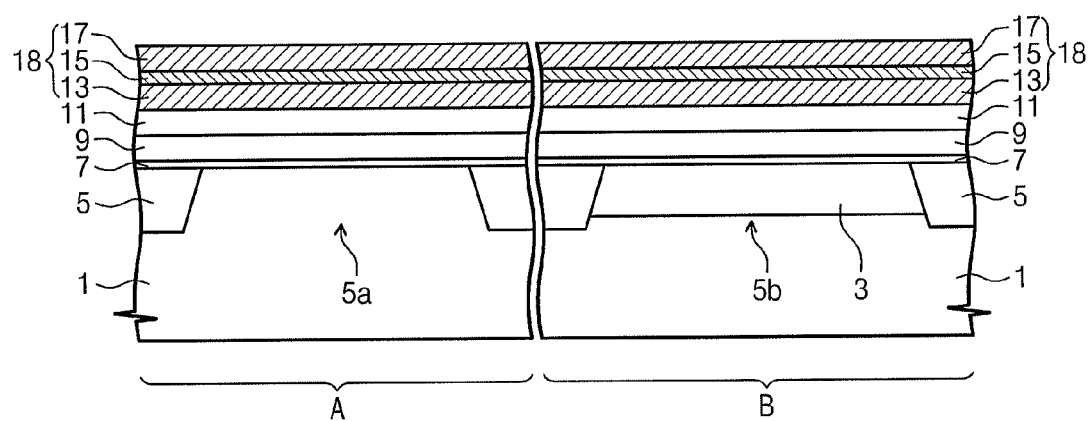
FIGS. 1 to 4 illustrate cross-sectional views relating to a method of fabricating a semiconductor device according to an embodiment and a semiconductor device fabricated thereby.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope.

FIGS. 1 to 4 are cross-sectional views to illustrate a method of fabricating a semiconductor device according to an embodiment.

Referring to FIG. 1, a semiconductor substrate 1 having a first region A and a second region B may be provided. In an example embodiment, the first region A may be an N-channel MOS transistor region and the second region B may be a P-channel MOS transistor region. Moreover, the semiconductor substrate 1 may be a silicon substrate.

A device isolation layer 5 may be formed at a predetermined region of the semiconductor substrate 1. The device isolation layer 5 may define a first active region 5a in the first region A and a second active region 5b in the second region B, respectively. A semiconductor layer 3 may be formed on the second active region 5b. The semiconductor layer 3 may have a band gap energy that is less than that of the semiconductor substrate 1. For example, the semiconductor layer 3 may include a silicon germanium layer. The semiconductor layer 3, e.g., the silicon germanium layer may be formed to improve threshold voltage characteristics of MOS transistors (e.g., P-channel MOS transistors) to be formed in the second region B.

A lower gate insulating layer 9 containing nitrogen may be formed on the substrate having the device isolation layer 5 and/or the semiconductor layer 3. In an example embodiment, the nitrogen containing lower gate insulating layer 9 may be formed by depositing a lower high-k dielectric layer and nitrifying the lower high-k dielectric layer. The lower high-k dielectric layer may be formed of a metal oxide layer and/or a metal silicate layer. For example, the lower high-k dielectric layer may be formed of at least one of a hafnium oxide (HfO) layer, a hafnium silicate (HfSiO) layer, a zirconium oxide (ZrO) layer and a zirconium silicate (ZrSiO) layer.

Nitrification of the lower high-k dielectric layer may be performed using a process gas containing nitrogen at a temperature within the range of about 400 degrees Celsius to about 750 degrees Celsius. The nitrogen containing process gas may include a nitrogen gas and/or an ammonia gas. Moreover, an annealing process may be applied to the nitrified lower high-k dielectric layer after nitrification of the lower high-k dielectric layer. The annealing process may be performed at a temperature within the range of about 900 degrees Celsius to about 1100 degrees Celsius. The nitrogen containing lower gate insulating layer 9 may be formed to have a sufficient nitrogen concentration to stabilize reliability and electrical characteristics of MOS transistors to be formed in at least the first region A.

In another example embodiment, an interfacial insulating layer 7 may be additionally formed on an entire surface of the substrate having the device isolation layer 5 and/or the semiconductor layer 3, prior to formation of the lower gate insulating layer 9. The interfacial insulating layer 7 may act as a buffer layer that alleviates stress generated between the lower gate insulating layer 9 and the semiconductor substrate 1 or as a barrier layer that prevents impurity diffusion between the lower gate insulating layer 9 and the semiconductor substrate 1.

An upper gate insulating layer 11 may be formed on the nitrogen containing lower gate insulating layer 9. Formation of the upper gate insulating layer 11 may include forming an upper high-k dielectric layer on the lower gate insulating layer 9. The upper high-k dielectric layer may be formed of a metal oxide layer and/or a metal silicate layer. For example, the upper high-k dielectric layer may be formed of at least one of a hafnium oxide (HfO) layer, a hafnium silicate (HfSiO) layer, a zirconium oxide (ZrO) layer and a zirconium silicate (ZrSiO) layer.

In another example embodiment, formation of the upper gate insulating layer 11 may further include applying at least one of a nitrification process and an annealing process to the upper high-k dielectric layer. The nitrification process of the upper high-k dielectric layer may be substantially the same as the nitrification process of the lower high-k dielectric layer. The annealing process of the upper high-k dielectric layer may also be substantially the same as the annealing process of the lower high-k dielectric layer. In the event that the nitrification process is not applied to the upper high-k dielectric layer, the upper gate insulating layer 11 may be a nitrogen free high-k dielectric layer.

The process of nitrifying the upper high-k dielectric layer may be performed limitedly so that the nitrogen concentration of the upper gate insulating layer 11 is lower than that of the nitrogen containing lower gate insulating layer 9. That is, the nitrogen concentration of an upper portion adjacent to an upper surface of the upper gate insulating layer 11 may be lower than that of an upper portion adjacent to an upper surface of the nitrogen containing lower gate insulating layer 9. Providing a lower nitrogen concentration provides a lower wet etch rate of the upper gate insulating layer 11 when the upper gate insulating layer 11 is exposed to a wet etchant in a subsequent process.

A lower metal layer 18 may be formed on the upper gate insulating layer 11. In an example embodiment, the lower metal layer 18 may be formed by sequentially stacking a first titanium nitride layer 13, an aluminum layer 15 and a second titanium nitride layer 17. In this case, the first titanium nitride layer 13, the aluminum layer 15 and the second titanium nitride layer 17 may react on each other in a subsequent annealing process, thereby forming a metal alloy layer that acts as a substantial gate electrode layer of MOS transistors to be formed in the second region B.

Figure 2:
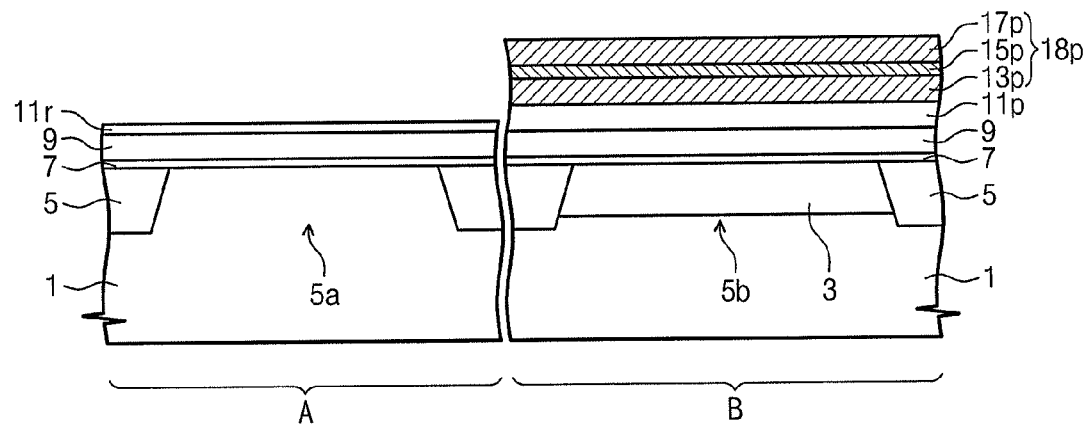

Referring to FIG. 2, the upper metal layer 18 may be patterned to remove the lower metal layer 18 in the first region A and to form a lower metal layer pattern 18p made of the un-etched metal layer existing in the second region B. In the event that the lower metal layer 18 is formed by sequentially stacking the first titanium nitride layer 13, the aluminum layer 15 and the second titanium nitride layer 17, the lower metal layer pattern 18p may include a first titanium nitride layer pattern 13p, an aluminum layer pattern 15p and a second titanium nitride layer pattern 17p which are sequentially stacked.

The lower metal layer 18 may be patterned using a wet etching process. The wet etching process may minimize any etching damage applied to the gate insulting layers 9 and 11 in the first region A.

The wet etching process for patterning the lower metal layer 18 may be performed using a mixture of an ammonium hydroxide ($NH_4OH$) solution, a hydrogen peroxide ($H_2O_2$) solution and de-ionized water. The upper and lower gate insulating layers 11 and 9 may also be etchable by the mixture of an ammonium hydroxide ($NH_4OH$) solution, a hydrogen peroxide ($H_2O_2$) solution and de-ionized water. However, according to the embodiment set forth above, the upper gate insulating layer 11 is formed on the nitrogen containing lower gate insulating layer 9. Thus, even though the wet etching process for patterning the lower metal layer 18 in the first region A is performed, the upper gate insulating layer 11 can protect the nitrogen containing lower gate insulating layer 9 from being exposed. The upper gate insulating layer 11 may act as a sacrificial layer that protects the nitrogen containing lower gate insulating layer 9 in the first region A during removal of the lower metal layer 18 in the first region A.

The higher the nitrogen concentration of the gate insulating layers 9 and 11 is, the more increased the wet etch rate of the gate insulating layers 9 and 11 is. However, according to the embodiments, the upper gate insulating layer 11 may be formed of a nitrogen free high-k dielectric layer or may be formed to have a lower nitrogen concentration than the nitrogen containing lower gate insulating layer 9, as described above. Therefore, the wet etch rate of the upper gate insulating layer 11 may be lower than that of the nitrogen containing lower gate insulating layer 9. As a result, the upper gate insulating layer 11 may act as an etch stop layer that prevents exposure of the nitrogen containing lower gate insulating layer 9 while the lower metal layer 18 in the first region A is selectively removed using a wet etching process.

While the lower metal layer 18 in the first region A is selectively removed, the upper gate insulating layer 11 in the first region A may be partially etched. Thus, after formation of the lower metal layer pattern 18p, a residue layer 11r of the upper gate insulating layer 11 may exist on the nitrogen containing lower gate insulating layer 9 in the first region A and an upper gate insulating layer pattern 11p may be formed in the second region B. That is, the residue layer 11r may be thinner than the upper gate insulating layer pattern 11p.

In another example embodiment, while the lower metal layer 18 in the first region A is removed, the upper gate insulating layer 11 may be over-etched to expose the nitrogen containing lower gate insulating layer 9. Nevertheless, the loss of the nitrogen containing lower gate insulating layer 9 may be minimized due to the presence of the upper gate insulating layer 11.

Figure 3:
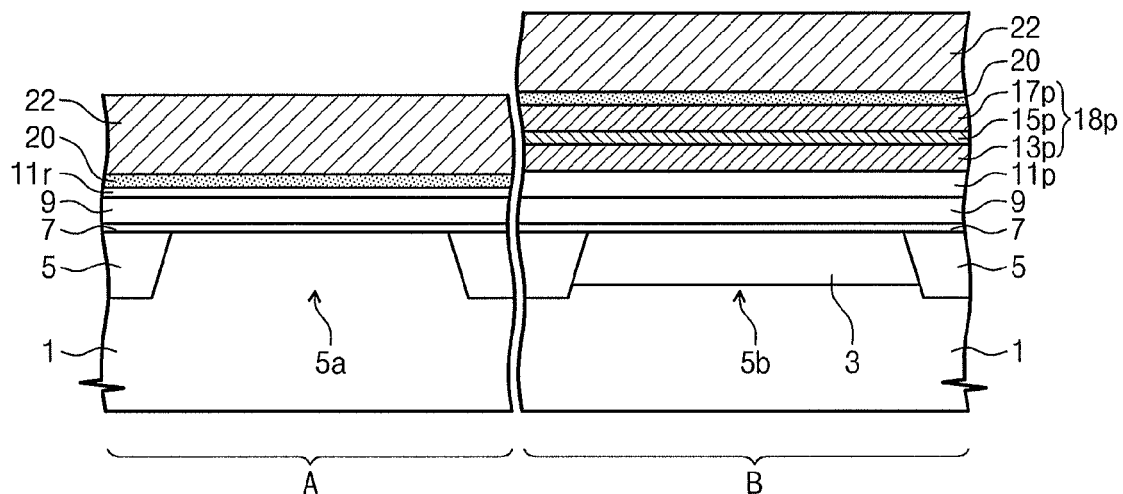

Referring to FIG. 3, an upper metal layer 22 may be formed on an entire surface of the substrate including the lower metal layer pattern 18p. The upper metal layer 22 may be formed of a metal layer having a different work function from the lower metal layer pattern 18p. The upper metal layer 22 may act as a substantial gate electrode layer of a MOS transistor to be formed in the first region A. In one example embodiment, the upper metal layer 22 may be formed of a single layer of titanium.

Prior to formation of the upper metal layer 22, a material layer containing lanthanum (La) may be additionally formed on an entire surface of the substrate having the lower metal layer pattern 18p. The material layer containing lanthanum (La) may include a lanthanum oxide (LaO) layer 20. The lanthanum oxide layer 20 may be formed to improve threshold voltage characteristics of MOS transistors to be formed in the first region A.

Lanthanum atoms in the lanthanum oxide layer 20 may be diffused toward an interface between the first active region 5a and the interfacial insulating layer 7 or an interface between the first active region 5a and the lower gate insulating layer 9 during a subsequent annealing process, thereby generating dipoles at the interface. These dipoles may decrease the threshold voltage of MOS transistors (e.g., N-channel MOS transistors) to be formed in the first region A.

Figure 4:
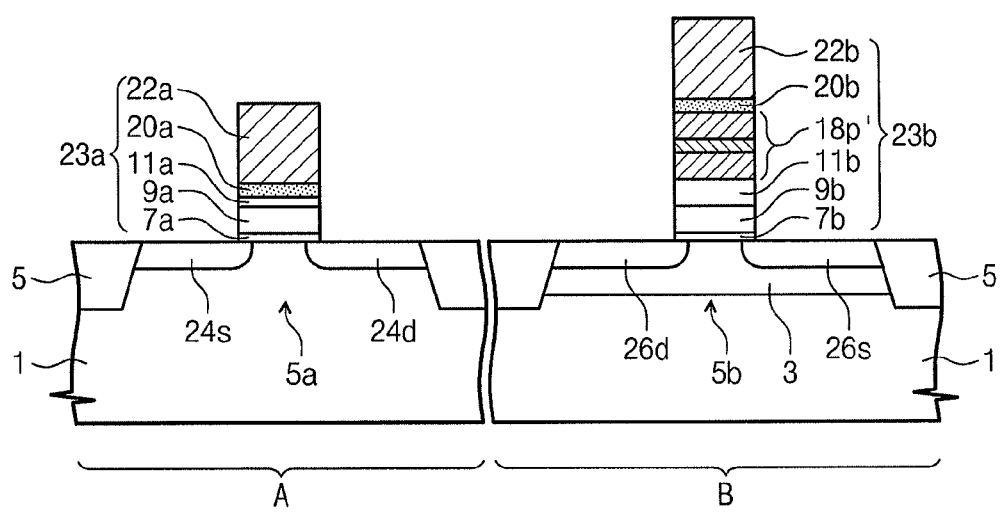

Referring to FIG. 4, the upper metal layer 22, the lanthanum oxide layer 20, the lower metal layer pattern 18p, the upper gate insulating layers 11r and 11p, the nitrogen containing lower gate insulating layer 9 and the interfacial insulating layer 7 may be patterned to form a first gate pattern 23a and a second gate pattern 23b on the first active region 5a and the second active region 5b respectively. Impurity ions of a first conductivity type may be implanted into the first active region 5a using the first gate pattern 23a and the device isolation layer 5 as ion implantation masks, thereby forming a first source region 24s and a first drain region 24d, which are spaced apart from each other. Similarly, impurity ions of a second conductivity type may be implanted into the second active region 5b using the second gate pattern 23b and the device isolation layer as ion implantation masks, thereby forming a second source region 26s and a second drain region 26d, which are spaced apart from each other. The first conductivity type may be an N-type and the second conductivity type may be a P-type. The impurity ions in the source/drain regions 24s, 24d, 26s and 26d may be activated by at least one annealing process.

Semiconductor devices according to example embodiments will be described with reference to FIG. 4.

Referring again to FIG. 4, a semiconductor substrate 1 having a first region A and a second region B is provided. The first and second regions A and B may correspond to an N-channel MOS transistor region and a P-channel MOS transistor region, respectively. The semiconductor substrate 1 may include a silicon substrate.

A device isolation layer 5 may be disposed at a predetermined region of the semiconductor substrate 1. The device isolation layer 5 may define a first active region 5a in the first region A and a second active region 5b in the second region B, respectively. A first source region 24s and a first drain region 24d, which are spaced apart from each other, may be disposed in the first active region 5a. Similarly, a second source region 26s and a second drain region 26d, which are spaced apart from each other, may be disposed in the second active region 5b. A first gate pattern 23a may be disposed on a first channel region between the first source region 24s and the first drain region 24d, and a second gate pattern 23b may be disposed on a second channel region between the second source region 26s and the second drain region 26d. The second channel region between the second source region 26s and the second drain region 26d may include semiconductor layer 3 that has a band gap energy that less than that of the semiconductor substrate 1. For example, the semiconductor layer 3 may include silicon germanium.

The first gate pattern 23a may include a first nitrogen-containing lower gate insulating layer pattern 9a and a first metal gate electrode 22a, which are sequentially stacked, and the second gate pattern 23b may include a second nitrogen-containing lower gate insulating layer pattern 9b, a second upper gate insulating layer pattern 11b and a second lower metal gate electrode 18p', which are sequentially stacked. The first metal gate electrode 22a may have a different work function from the second lower metal gate electrode 18p'.

Each of the first and second nitrogen-containing lower gate insulating layer patterns 9a and 9b may include a nitrogen-containing high-k dielectric layer. In one example embodiment, the nitrogen-containing high-k dielectric layer may include a nitrified metal oxide layer or a nitrified metal silicate layer.

In another example embodiment, the first gate pattern 23a may further include a first upper gate insulating layer pattern 11a disposed between the first nitrogen-containing lower gate insulating layer pattern 9a and the first metal gate electrode 22a. The first upper gate insulating layer pattern 11a may be the same material layer as the second upper gate insulating layer pattern 11b. Each of the first and second upper gate insulating layer patterns 11a and 11b may include a nitrogen-containing high-k dielectric layer or a nitrogen-free high-k dielectric layer. The first upper gate insulating layer pattern 11a may be thinner than the second upper gate insulating layer pattern 11b.

In the event that the first and second upper gate insulating layer patterns 11a and 11b include the nitrogen-containing high-k dielectric layer, the nitrogen concentration of the first and second upper gate insulating layer patterns 11a and 11b may be lower than that of the first and second nitrogen containing lower gate insulating layer patterns 9a and 9b.

In another example embodiment, the first gate pattern 23a may further include a first lanthanum oxide layer pattern 20a disposed between the first lower gate insulating layer pattern 9a and the first metal gate electrode 22a. If the first gate pattern 23a include the first upper gate insulating layer pattern 11a, the first lanthanum oxide layer pattern 20a may be disposed between the first upper gate insulating layer pattern 11a and the first metal gate electrode 22a.

Moreover, the second gate pattern 23b may further include a second upper metal gate electrode 22b disposed on the second lower metal gate electrode 18p'. The second upper metal gate electrode 22b may be the same metal layer as the first metal gate electrode 22a. In addition, the second gate pattern 23b may further include a second lanthanum oxide layer pattern 20b disposed between the second upper metal gate electrode 22b and the second lower metal gate electrode 18p'.

In another example embodiment, the first gate pattern 23a may further include a first interfacial insulating layer pattern 7a disposed between the first nitrogen containing lower gate insulating layer pattern 9a and the first active region 5a. Similarly, the second gate pattern 23b may further include a second interfacial insulating layer pattern 7b disposed between the second nitrogen containing lower gate insulating layer pattern 9b and the second active region 5b.

Figure 5:
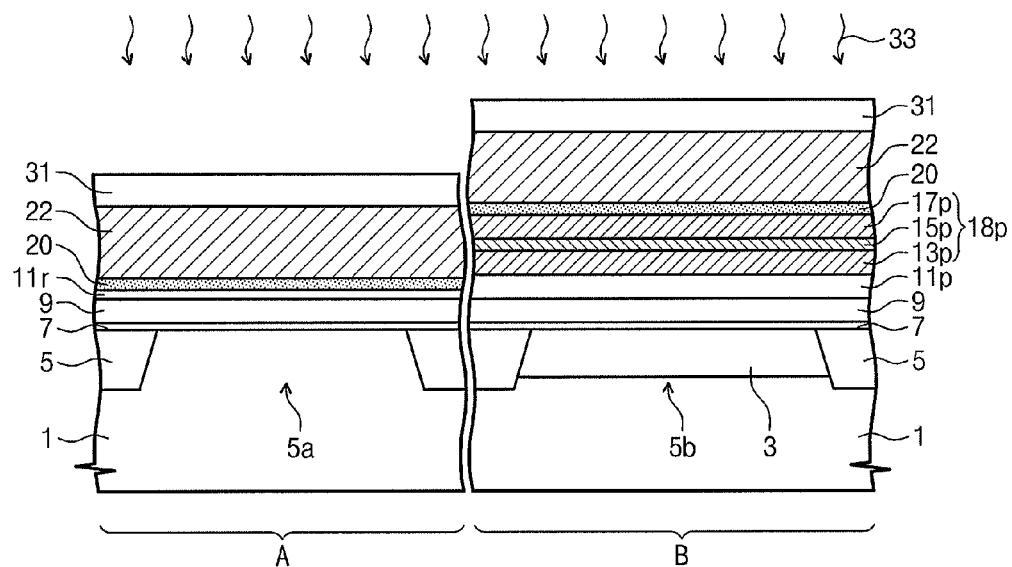
FIGS. 5 to 7 illustrate cross-sectional views relating to a method of fabricating a semiconductor device according to another embodiment and a semiconductor device fabricated thereby.
Figure 6:
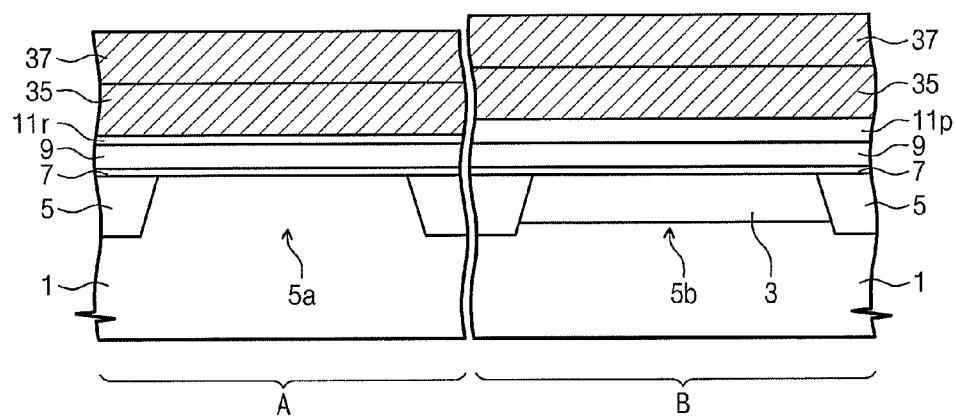
Figure 7:
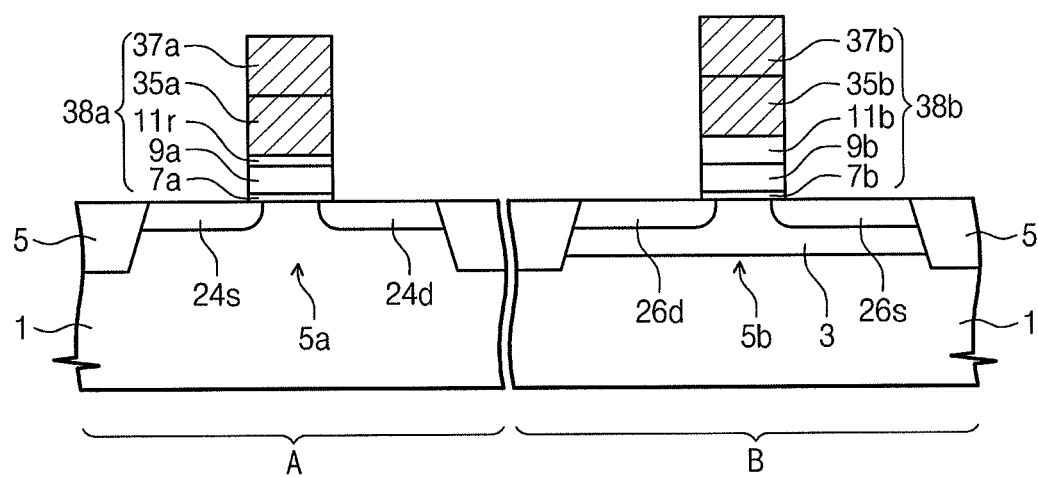

FIGS. 5 to 7 are cross-sectional views to illustrate a method of fabricating a semiconductor device according to another embodiment and a semiconductor device fabricated thereby.

Referring to FIG. 5, the silicon layer 3, the device isolation layer 5, the interfacial insulating layer 7, the nitrogen containing lower gate insulating layer 9, the upper gate insulating layer pattern 11p, the lower metal layer pattern 18p, the lanthanum containing material layer 20 and the upper metal layer 22 may be formed on the semiconductor substrate 1 using the same manners as described with reference to FIGS. 1 to 3. The semiconductor substrate 1 may have a first region A and a second region B, as described with reference to FIG. 1.

A hard mask layer 31 may be formed on the upper metal layer 22, and an annealing process 33 may be applied to the substrate including the hard mask layer 31. During the annealing process 33, lanthanum atoms in the lanthanum containing material layer 20 may be diffused toward an interface between the semiconductor substrate 1 in the first region A and the interfacial insulating layer 7 or an interface between the semiconductor substrate 1 in the first region A and the nitrogen containing lower gate insulating layer 9, thereby generating dipoles at the interface. These dipoles may lower the threshold voltage of MOS transistors (e.g., N-channel MOS transistors) to be formed in the first region A, as described with reference to FIG. 3.

The hard mask layer 31 may be formed of a silicon oxide layer or a silicon layer. The annealing process 33 may be a rapid thermal annealing process that is performed at a temperature within the range of about 900 degrees Celsius to about 1100 degrees Celsius.

Referring to FIG. 6, the hard mask layer 31, the upper metal layer 22 and the lower metal layer pattern 18p may be removed to expose the residue layer 11r and the upper gate insulating layer pattern 11p after the annealing process 33. During removal of the upper metal layer 22 and the lower metal layer pattern 18p, the lanthanum containing material layer 20 may also be removed. A gate metal layer 35 may be formed on the exposed upper gate insulating layer pattern 11p and the exposed residue layer 11r. In addition, a silicon layer 37 may be formed on the gate metal layer 35. In one example embodiment, the gate metal layer 35 may be formed of a titanium nitride (TiN) layer.

Referring to FIG. 7, the silicon layer 37, the gate metal layer 35, the upper gate insulating layer pattern 11p, the residue layer 11r, the nitrogen containing lower gate insulating layer 9 and the interfacial insulating layer 7 are patterned to form a first gate pattern 38a and a second gate pattern 38b on the first active region 5a and the second active region 5b respectively. As a result, the first gate pattern 38a may include a first nitrogen-containing lower gate insulating layer pattern 9a and a first metal gate electrode 35a which are sequentially stacked, and the second gate pattern 38b may include a second nitrogen-containing lower gate insulating layer pattern 9b, a second upper gate insulating layer pattern 11b and a second metal gate electrode 35b which are sequentially stacked. In another example embodiment, the first gate pattern 38a may further include a first silicon pattern 37a on the first metal gate electrode 35a, and the second gate pattern 38b may further include a second silicon pattern 37b on the second metal gate electrode 35b. According to the example embodiments, the first and second metal gate electrodes 35a and 35b may be formed of the same metal layer. Nevertheless, it is possible to optimize the threshold voltage characteristics of N-channel MOS transistors and P-channel MOS transistors to be formed in the first region A and the second region B respectively. That is, the threshold voltage characteristic of the N-channel MOS transistors in the first region A may be optimized by the lanthanum atoms as set forth above, and the threshold voltage characteristic of the P-channel MOS transistors in the second region B may be optimized by the work function of the second metal gate electrode 35b or the band gap energy of the semiconductor layer 3 as set forth above.

Impurity ions of a first conductivity type may be implanted into the first active region 5a using the first gate pattern 38a and the device isolation layer 5 as ion implantation masks, thereby forming a first source region 24s and a first drain region 24d which are spaced apart from each other. In addition, impurity ions of a second conductivity type may be implanted into the second active region 5b using the second gate pattern 38b and the device isolation layer 5 as ion implantation masks, thereby forming a second source region 26s and a second drain region 26d which are spaced apart from each other. The first conductivity type may be an N-type, and the second conductivity type may be a P-type.

By way of summation and review, a high-k gate dielectric layer used as a gate insulating layer may contain a lot of oxygen vacancies therein. These oxygen vacancies may act as charge trap sites, thereby degrading the reliability and electrical characteristics of the MOS transistors. The oxygen vacancies in the high-k gate dielectric layer may be removed by nitrifying the high-k gate dielectric layer. For example, the oxygen vacancies in the high-k gate dielectric layer may be removed using a nitrogen passivation process to provide a high-k gate dielectric layer containing nitrogen. The nitrogen-containing high-k gate dielectric layer may exhibit a nitrogen profile that is non-uniform according to a depth thereof. For example, the nitrogen concentration of an upper portion adjacent to an upper surface of the nitrogen containing high-k gate dielectric layer may be higher than that of a lower portion adjacent to a lower surface of the nitrogen containing high-k gate dielectric layer.

To form a first metal gate electrode for the N-channel MOS transistors with a different material from a second metal gate electrode for the P-channel MOS transistors, a high-k gate dielectric layer containing nitrogen may be formed on an entire surface of a semiconductor substrate having an N-channel MOS transistor region and a P-channel MOS transistor region, and a first metal layer may be formed on the high-k gate dielectric layer. The first metal layer in the N-channel MOS transistor region may then be selectively etched to form a first metal layer pattern, which remains in the P-channel MOS transistor region. While the first metal layer in the N-channel MOS transistor region is selectively etched, an upper portion of the high-k gate dielectric layer in the N-channel MOS transistor region may also be etched. As a result, the nitrogen concentration of the high-k gate dielectric layer in the N-channel MOS transistor region may be lower than that of the high-k gate dielectric layer in the P-channel MOS transistor region. Accordingly, performance of the MOS transistors formed in the N-channel MOS transistor region may be degraded.

In this regard, the embodiments disclosed herein advance the art by providing a lower gate insulating layer, an upper gate insulating layer and a lower metal layer are sequentially formed on a semiconductor substrate having a first region and a second region, and the lower metal layer is patterned to selectively remove the lower metal layer in the first region. Thus, during removal of the lower metal layer in the first region, etching of the lower gate insulating layer in the first region may be prevented. This is due to the presence of the upper gate insulating layer which acts as a protection layer or an etch stop layer. As a result, it can prevent reliability and threshold voltage characteristics of MOS transistors to be formed in the first region from being degraded. This is because the property of the lower gate insulating layer can be maintained even after removal of the lower metal layer in the first region.

In addition, the upper gate insulating layer may be formed to have a lower nitrogen concentration than the lower gate insulating layer. In this case, the wet etching rate of the upper gate insulating layer may be minimized during a wet etching process for removing the lower metal layer in the first region. Thus, the thickness difference between the first gate insulating layer and the second gate insulating layer, which exist in the first region and the second region respectively, may be minimized after removal of the lower metal layer in the first region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   providing a semiconductor substrate having a first region and a second region;
   forming a nitrogen-containing lower gate insulating layer on the semiconductor substrate;
   forming an upper gate insulating layer on the nitrogen-containing lower gate insulating layer;
   forming a lower metal layer on the upper gate insulating layer; and selectively removing the lower metal layer in the first region to form a lower metal layer pattern in the second region, wherein the upper gate insulating layer in the first region prevents the nitrogen-containing lower gate insulating layer in the first region from being etched during removing of the lower metal layer in the first region the upper gate insulating layer in the first region being partially etched during removing of the lower metal layer in the first region such that at least a portion of the upper gate insulating layer remains on the nitrogen-containing lower gate insulating layer in the first region after the lower metal layer in the first region has been selectively removed.

2. The method as claimed in claim 1, wherein the first region and the second region are an N-channel MOS transistor region and a P-channel MOS transistor region, respectively.

3. The method as claimed in claim 1, wherein the forming of the nitrogen-containing lower gate insulating layer includes:
   forming a lower high-k dielectric layer on the semiconductor substrate; and
   nitrifying the lower high-k dielectric layer.

4. The method as claimed in claim 1, wherein the forming of the upper gate insulating layer includes forming an upper high-k dielectric layer on the nitrogen-containing lower gate insulating layer, the upper high-k dielectric layer being a metal oxide layer or a metal silicate layer, and applying at least one of a nitrification process and an annealing process to the upper high-k dielectric layer.

5. The method as claimed in claim 4, wherein:
   the nitrification process is applied to the upper high-k dielectric layer to form the upper gate insulating layer, and
   after the nitrification process is applied, the upper gate insulating layer has a nitrogen concentration that is lower than that of the nitrogen-containing lower gate insulating layer.

6. The method as claimed in claim 1, wherein the lower metal layer is formed by sequentially stacking a first titanium nitride layer, an aluminum layer and a second titanium nitride layer.

7. The method as claimed in claim 1, further comprising forming an upper metal layer on the semiconductor substrate after forming the lower metal layer pattern.

8. The method as claimed in claim 1, further comprising:
   forming a lanthanum-containing material layer on the semiconductor substrate after forming the lower metal layer pattern, and
   forming an upper metal layer on the semiconductor substrate after forming the lower metal layer pattern.

9. A method of fabricating a semiconductor device, the method comprising:
   forming a nitrogen-containing lower gate insulating layer on a semiconductor substrate having a first region and a second region;
   forming an upper gate insulating layer on the nitrogen-containing lower gate insulating layer;
   forming a lower metal layer on the upper gate insulating layer; and
   selectively removing the lower metal layer in the first region to form a lower metal layer pattern in the second region and partially removing the upper gate insulating layer to form a residue layer in the first region and in upper gate insulating layer pattern in the second region.

10. The method as claimed in claim 9, further including:
    forming a lanthanum-containing material layer and an upper metal layer on the semiconductor substrate,
    forming a hard mask layer on the upper metal layer, and
    performing annealing such that lanthanum atoms in the lanthanum-containing material layer diffuse toward an interface between the semiconductor substrate and the nitrogen-containing lower gate insulating layer.

11. The method as claimed in claim 10, further including:
    after the annealing, removing the hard mask layer, the upper metal layer, the lower metal layer pattern and the lanthanum-containing material layer to expose the residue layer and the upper gate insulating layer pattern, and
    forming a gate metal layer on the residue layer and the upper gate insulating layer pattern.

* * * * *